United States Patent [19]
Hwang

[11] Patent Number: 5,852,481
[45] Date of Patent: Dec. 22, 1998

[54] LIQUID CRYSTAL DISPLAY WITH TWO GATE ELECTRODES EACH HAVING A NON-ANODIZING AND ONE ANODIZING METALLIC LAYER AND METHOD OF FABRICATING

[75] Inventor: Kwang Jo Hwang, Anyang, Rep. of Korea

[73] Assignee: LG Electronics, Inc., Seoul, Rep. of Korea

[21] Appl. No.: 927,088

[22] Filed: Sep. 10, 1997

[30] Foreign Application Priority Data

Sep. 10, 1996 [KR] Rep. of Korea ............ 96-39167

[51] Int. Cl.⁶ ................ G02F 1/136; H01L 29/93; H01L 23/48
[52] U.S. Cl. ............ 349/43; 349/46; 438/30; 257/595; 257/762
[58] Field of Search ............ 349/43, 46; 438/30, 438/163; 257/34, 158, 595, 466, 762

[56] References Cited

U.S. PATENT DOCUMENTS

| | | | |
|---|---|---|---|
| 5,054,887 | 10/1991 | Kasto et al. | 359/59 |
| 5,055,899 | 10/1991 | Wakai et al. | 349/43 |
| 5,187,602 | 2/1993 | Ikeda et al. | 359/59 |
| 5,428,250 | 6/1995 | Ikeda et al. | 257/762 |
| 5,555,112 | 9/1996 | Oritsuki et al. | 349/46 |
| 5,621,556 | 4/1997 | Fulks et al. | 349/43 |
| 5,644,147 | 7/1997 | Yamazaki et al. | 257/66 |
| 5,739,877 | 4/1998 | Onisawa et al. | 349/46 |

*Primary Examiner*—William L. Sikes
*Assistant Examiner*—Tarifur R. Chowdhury

[57] ABSTRACT

The method of fabricating a liquid crystal display device forms a first and second gate electrode on a first and second region, respectively, of a substrate. The first and second gate electrodes each include a non-anodizing metallic layer and at least one anodizing metallic layer. The two metallic layers also have different etching selection ratios. A first insulating layer is formed on the anodizing metallic layer of the first and second gate electrodes, and at least a second insulating layer is formed over the substrate. A thin film transistor structure, which utilizes the first gate electrode as a gate, is formed on the second insulating layer. The thin film transistor structure includes a semiconductor layer on the second insulating layer over the first gate electrode, an impurity semiconductor layer on first and second portions of the semiconductor layer, and first and second source/drain electrodes on the impurity semiconductor layer covering the first and second portions of the semiconductor layer, respectively. The method further includes the steps of depositing a passivation layer over the substrate, and forming first and second contacts holes. The first contact hole exposes the first source/drain electrode, and the second contact hole exposes the second gate electrode. A pixel electrode is formed on the passivation layer and in contact with the first source/drain electrode and the second gate electrode.

32 Claims, 2 Drawing Sheets

LIQUID CRYSTAL DISPLAY WITH TWO GATE ELECTRODES EACH HAVING A NON-ANODIZING AND ONE ANODIZING METALLIC LAYER AND METHOD OF FABRICATING

BACKGROUND OF THE INVENTION

1. Field of the Invention

The present invention relates to a liquid crystal display device and a method of fabricating the same.

2. Description of Related Art

As a display device of a television, a personal computer, etc., a large size cathode ray tube (CRT) display device has been used. However, since the screen of a CRT must be more than a predetermined distance from an electron gun in the display device, such a display device is quite large. Thus, a large CRT cannot be applied to a light weight, small size, and low power consumption electronic device such as a wall-mounted television, a portable television, a notebook computer, etc.

As a small and light weight display device, flat panel display devices, such as an LCD (liquid crystal display), a PDP (plasma display panel) and an ELD (electroluminescent display), have been introduced recently. Among the above flat panel display devices, research has focused on LCDs because of their good picture quality and low power consumption.

There are two types of LCDs, a passive matrix driving LCD and an active matrix driving LCD (AMLCD). Of these LCDs, the AMLCD has mainly been used because the switching elements therein independently operate each pixel to obtain a high contrast ratio and a high resolution while minimizing interference between neighboring pixels.

In the AMLCD, a thin film transistor (TFT) is used as a switching element, i.e., the active element. The conventional method of fabricating the TFT LCD will be described in detail with respect to FIGS. 1A–1D. In FIGS. 1A–1D, the substrate on which the TFT array is formed, is divided into a TFT region, which contains the TFTs, and a pad region, which connects the TFTs and a driving circuit.

In the TFT region, metal is deposited on a transparent glass substrate 10 and then etched to form a first gate electrode layer 11. A second gate electrode layer 12 is then formed in the TFT and pad regions, respectively. As shown in FIG. 1A, a first gate electrode 250 in the TFT region includes the first gate electrode layer 11 and the second gate electrode 12 layer (i.e., a two layer gate electrode). The second gate electrode 260 in the pad region includes only the second gate electrode layer 12. The second gate electrode 260 is a pad for connecting the TFT and the driving circuit. Subsequently, photoresist is formed over the pad region, and the second gate electrode layer 12 in the TFT region is anodized to form the anodizing layer 14. The photoresist prevents the second gate electrode 260 from anodizing.

Thereafter, a gate insulating layer 15, including a SiOx layer and a SiNx layer, is deposited over the substrate 10. Next, amorphous silicon(a-Si), $n^+$ a-Si, and metal are successively deposited and, in a single process, are etched to form a semiconductor layer 17, a $n^+$ layer 18, and source/drain electrodes 19, as shown in FIG. 1B.

As shown in FIG. 1C, a passivation layer 21 is deposited over the substrate and then etched to form contact holes exposing one of the source/drain electrodes 19 in the TFT region and the second gate electrode layer 12 of the second gate 260 in the pad region. Subsequently, indium tin oxide (ITO) is deposited on the passivation layer 21 and etched to form a pixel electrode 22. The pixel electrode 22 is connected to the exposed source/drain electrode 19 and the second gate electrode layer 12 of the second gate 260 through the contact holes.

In the conventional method, seven masks for patterning the first and second gate electrode layers, anodizing the second gate electrode layer of the first gate electrode, patterning the semiconductor layer and $n^+$ semiconductor layer, forming the source/drain electrodes, patterning the passivation layer, and patterning the pixel electrode must be used. Because the process is complicated, the yield deteriorates and the cost increases.

SUMMARY OF THE INVENTION

An object of the present invention is to provide a simplified method of fabricating a liquid crystal display device and a liquid crystal display device.

Another object of the present invention is to provide a method of fabricating a liquid crystal display device which increases yield and reduces cost.

These and other objects are achieved by providing a method of fabricating a liquid crystal display device, comprising: forming a first and second gate electrode on a first and second region, respectively, of a substrate, the first and second gate electrodes each including a non-anodizing metallic layer and at least one anodizing metallic layer; forming a first insulating layer on the anodizing metallic layer of the first and second gate electrodes; forming at least a second insulating layer over the substrate; forming a thin film transistor structure which utilizes the first gate electrode as a gate, the thin film transistor structure including a semiconductor layer on the second insulating layer over the first gate electrode, an impurity semiconductor layer on first and second portions of the semiconductor layer, and first and second source/drain electrodes on the impurity semiconductor layer covering the first and second portions of the semiconductor layer, respectively; depositing a passivation layer over the substrate; forming first and second contacts holes, the first contact hole exposing the first source/drain electrode, and the second contact hole exposing the second gate electrode; and forming a pixel electrode on the passivation layer and in contact with the first source/drain electrode and the second gate electrode.

These and other objects are further achieved by providing a method of fabricating a liquid crystal display device, comprising: forming a first and second gate electrode on a first and second region, respectively, of a substrate, the first and second gate electrodes each including at least a first and second metallic layer, the first metallic layer having an etching ratio which differs from an etching ratio of the second metallic layer; forming a first insulating layer on the second metallic layer of the first and second gate electrodes; forming at least a second insulating layer over the substrate; forming a thin film transistor structure which utilizes the first gate electrode as a gate, the thin film transistor structure including a semiconductor layer on the second insulating layer over the first gate electrode, an impurity semiconductor layer on first and second portions of the semiconductor layer, and first and second source/drain electrodes on the impurity semiconductor layer covering the first and second portions of the semiconductor layer, respectively; depositing a passivation layer over the substrate; forming first and second contacts holes, the first contact hole exposing the first source/drain electrode, and the second contact hole exposing the second gate electrode; and forming a pixel electrode on the passivation layer and in contact with the first source/drain electrode and the second gate electrode.

These and other objects are still further achieved by providing a liquid crystal display device, comprising: a substrate; a first and second gate electrode formed on a first and second region, respectively, of the substrate, the first and second gate electrodes each including a non-anodizing metallic layer and at least one anodizing metallic layer; a first insulating layer formed on the anodizing metallic layer of the first and second gate electrodes; at least a second insulating layer formed over the substrate; a semiconductor layer formed on the second insulating layer over the first gate electrode; an impurity semiconductor layer formed on first and second portions of the semiconductor layer; first and second source/drain electrodes formed on the impurity semiconductor layer covering the first and second portions of the semiconductor layer, respectively; a passivation layer formed over the substrate, the passivation layer defining a first contact hole exposing the first source/drain electrode, the passivation layer and the first and second insulating layer defining a second contact hole exposing the second gate electrode; and a pixel electrode formed on the passivation layer and in contact with the first source/drain electrode and the second gate electrode via the first and second contact holes, respectively.

These and other objects are also achieved by providing a liquid crystal display device, comprising: a substrate; a first and second gate electrode formed on a first and second region, respectively, of the substrate, the first and second gate electrodes each including at least a first and second metallic layer, the first metallic layer having a different etching ratio than an etching ratio of the second metallic layer; a first insulating layer formed on the second metallic layer of the first and second gate electrodes; at least a second insulating layer formed over the substrate; a semiconductor layer formed on the second insulating layer over the first gate electrode; an impurity semiconductor layer formed on first and second portions of the semiconductor layer; first and second source/drain electrodes formed on the impurity semiconductor layer covering the first and second portions of the semiconductor layer, respectively; a passivation layer formed over the substrate, the passivation layer defining a first contact hole exposing the first source/drain electrode, the passivation layer and the first and second insulating layer defining a second contact hole exposing the second gate electrode; and a pixel electrode formed on the passivation layer and in contact with the first source/drain electrode and the second gate electrode via the first and second contact holes, respectively.

Other objects, features, and characteristics of the present invention; methods, operation, and functions of the related elements of the structure; combination of parts; and economies of manufacture will become apparent from the following detailed description of the preferred embodiments and accompanying drawings, all of which form a part of this specification, wherein like reference numerals designate corresponding parts in the various figures.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
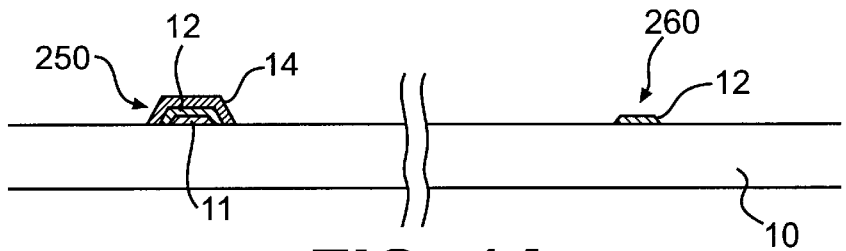
FIGS. 1A–1D are views showing the conventional method of fabricating a liquid crystal display device.
Figure 1B:
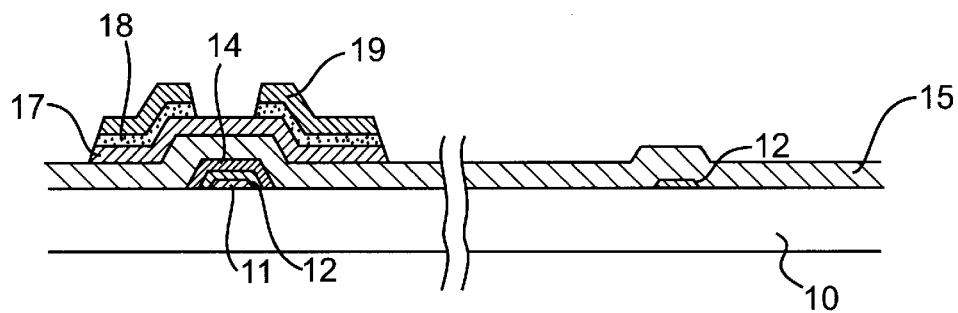
Figure 1C:
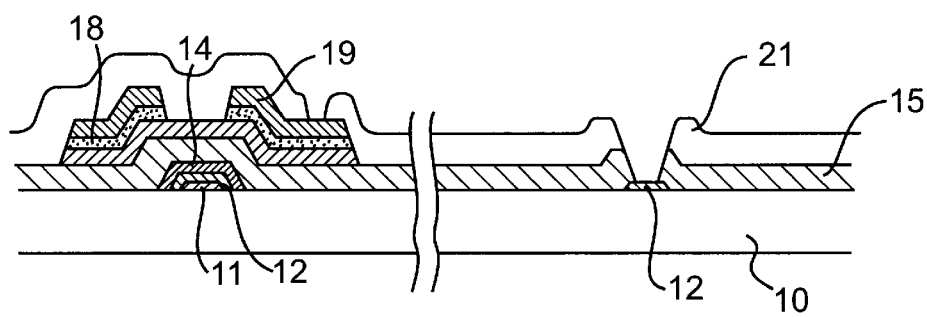
Figure 1D:
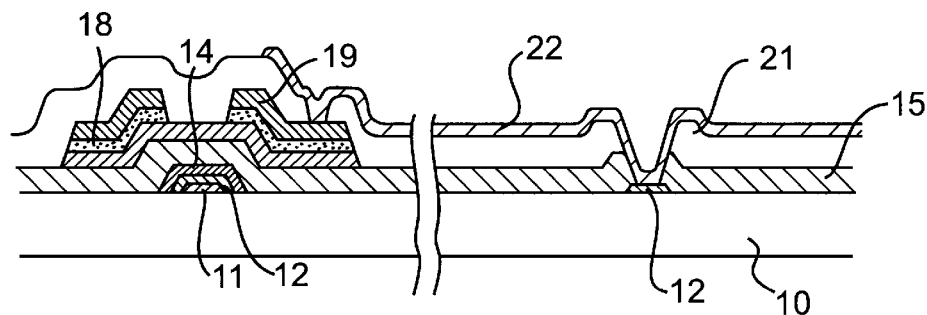
Figure 2A:
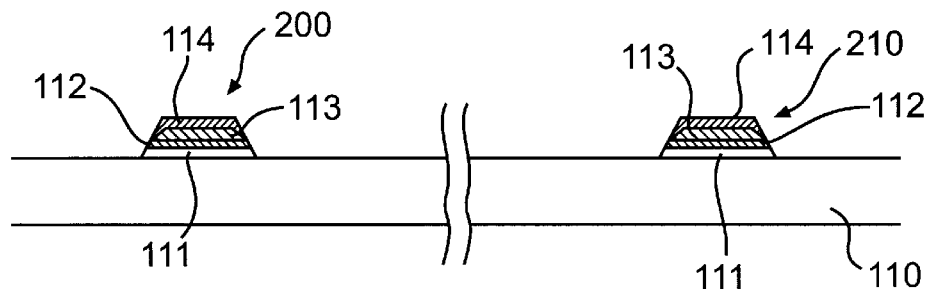
FIGS. 2A–2D are views showing the method of fabricating a liquid crystal display device according to the present invention.

FIGS. 2A–2D are views showing the method of fabricating a liquid crystal display device according to the present invention. As shown in FIG. 2A, three metal layers are formed on a transparent glass substrate 110 using a single sputtering process, and then, in a single process, are etched using one mask to form first and second gate electrodes 200 and 210 in the TFT and pad regions, respectively.

The first and second gate electrodes 200 and 210 include first gate electrode layer 111, second gate electrode layer 112, and third gate electrode layer 113. The first gate electrode layer 111 is made of a non-anodizing metal including Cr, Mo, and Ti, in which hillcocks are not generated, and the second and third gate electrode layers 112 and 113 are made of anodizing metal including at least one of Al and AlTa. An anodizing layer 114 is then formed on the third gate electrode layer 113 and on the sides of the second and third gate electrode layers 112 and 113; but not on the side of the first gate electrode layer 111. Further, since the etching selection ratio of the first gate electrode layer 111 is different from the etching selection ratio of the second and third gate electrode layers 112 and 113, only the second and third gate electrode layers 112 and 113 are etched during the contact hole formation process discussed in detail below.

The anodizing process will now be described in greater detail. After forming the first and second gate electrodes 200 and 210, the substrate 110 is dipped into a container containing electrolyte, and a counter electrode is set facing the substrate 110. The first and second gate electrodes 200 and 210 and the counter electrode are respectively connected to the anode and cathode of an electric power source. When a voltage is applied to the first and second gate electrodes 200 and 210 and the counter electrode by the electric power source, the first and second gate electrodes 200 and 210 are anodized.

Figure 2B:
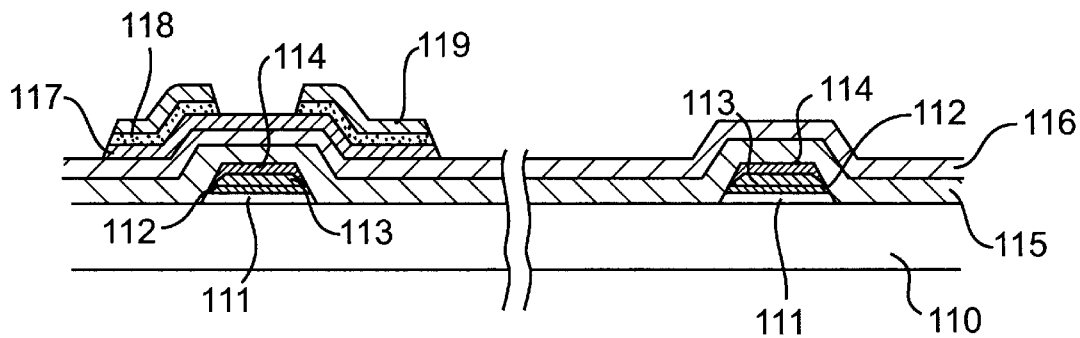

Thereafter, as shown in FIG. 2B, first and second insulating layers 115 and 116 are deposited over the substrate 110 by plasma chemical vapor deposition. The first insulating layer 115 includes a SiOx layer having good insulating characteristics, and the second insulating layer 116 includes a SiNx layer having good boundary characteristics. On the second insulating layer 116 of the TFT region, an a-Si semiconductor layer 117 and an $n^+$ a-Si layer 118 are formed by successively depositing a-Si and $n^+$ a-Si. On the $n^+$ a-Si layer 118, metal such as Cr, Mo, and Tr is deposited and etched to form source/drain electrodes 119. Then the $n^+$ a-Si layer 118 in the channel region between the source/drain electrodes 119 is etched using the source/drain electrodes 119 as a mask.

Figure 2C:
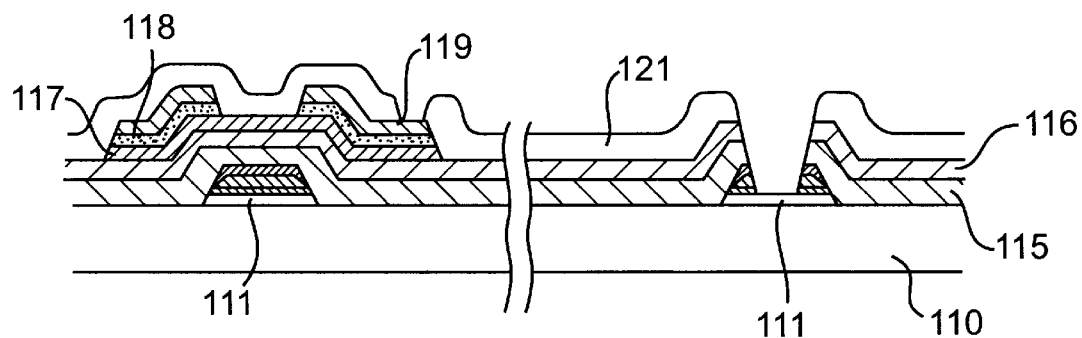

Subsequently, as shown in FIG. 2C, a passivation layer 121 is deposited over the substrate 110 by plasma chemical vapor deposition. The passivation layer 121 is etched using a plasma etching process to form contact holes exposing one of the source/drain electrodes 119 in the TFT region and the first gate electrode layer 111 of the second gate electrode 210 in the pad region. When the passivation layer 121 is etched, the first insulating layer 115, the second insulating layer 116, the second gate electrode layer 112 of the second gate electrode 210, and the third gate electrode 113 of the second gate electrode 210 are over-etched. As a result, the first gate electrode layer 111 of the second gate electrode 210 (i.e., the pad) is exposed.

As discussed above, the second and third gate electrode layers 112 and 113 are etched, but the first electrode layer 111 is not, because the etching selection ratio of the first gate electrode layer 111 is different from the etching selection ratio of the second and third gate electrode layers 112 and 113. In the TFT region, on the other hand, only passivation layer 121 is etched because the source/drain electrodes 119 are made of the same metal forming the first gate electrode layer 111 (e.g., Cr, Mo, and Ti, etc.).

Figure 2D:
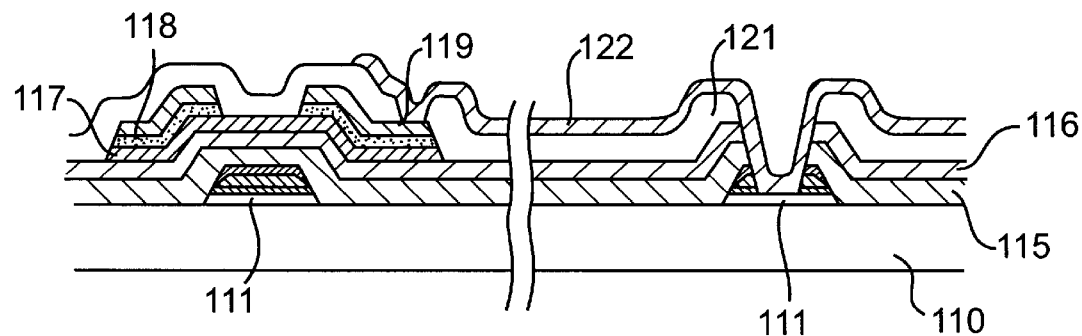

Thereafter, as shown in FIG. 2D, the pixel electrode 122 is formed on the passivation layer 121 by depositing and etching a transparent metal such as indium tin oxide. The pixel electrode 122 is connected to the exposed source/drain electrode 119 in the TFT region and the first gate electrode layer 111 of the second gate electrode 210 via the contact holes.

In the above method, the gate electrodes of the TFT and pad regions are formed by depositing, successively, and etching, in a single process, three metal layers. Further, the first gate electrode layer is made of a non-anodizing metal, while the second and the third gate electrode layers are made of anodizing metal. Therefore, the gate electrodes of the TFT region and the pad region can be anodized simultaneously. As a result, only five masks for patterning the gate electrode, patterning the semiconductor layer and the $n^+$ semiconductor layer, forming the source/drain electrodes, patterning the passivation layer, and patterning the pixel electrode are used in the LCD fabrication method according to the present invention. Accordingly, the fabricating process is simplified, the yield is improved, and the cost is decreased.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a liquid crystal display device, comprising:

forming a first and second gate electrode on a first and second region, respectively, of a substrate, the first and second gate electrodes each including a non-anodizing metallic layer and at least one anodizing metallic layer;

forming a first insulating layer on the anodizing metallic layer of the first and second gate electrodes;

forming at least a second insulating layer over the substrate;

forming a thin film transistor structure which utilizes the first gate electrode as a gate, the thin film transistor structure including a semiconductor layer on the second insulating layer over the first gate electrode, an impurity semiconductor layer on first and second portions of the semiconductor layer, and first and second source/drain electrodes on the impurity semiconductor layer covering the first and second portions of the semiconductor layer, respectively;

depositing a passivation layer over the substrate;

forming first and second contacts holes, the first contact hole exposing the first source/drain electrode, and the second contact hole exposing the second gate electrode; and forming a pixel electrode on the passivation layer and in contact with the first source/drain electrode and the second gate electrode.

2. The method according to claim 1, wherein the first insulating layer is formed on the anodizing metallic layer and sidewalls thereof.

3. The method according to claim 1, wherein the non-anodizing metallic layer has an etching selection ratio which differs from an etching selection ratio of the anodizing metallic layer.

4. The method according to claim 1, wherein the non-anodizing metallic layer includes one of Cr, Mo, and Ti.

5. The method according to claim 1, wherein the anodizing metallic layer includes one of Al and AlTa.

6. The method according to claim 1, wherein the step of forming the first and second gate electrodes comprises:

forming a non-anodizing metallic layer over the substrate;

forming at least one anodizing metallic layer on the non-anodizing metallic layer;

patterning, in a single process, the non-anodizing metallic layer and the anodizing metallic layer to form the first and second gate electrodes.

7. The method according to claim 1, wherein the forming a first insulating layer step comprises the sub-step of:

anodizing the anodizing metallic layer of the first and second gate electrodes.

8. The method according to claim 1, wherein the forming at least a second insulating layer comprises the sub-steps of:

forming a second insulating layer over the substrate; and successively forming a third insulating layer on the second insulating layer.

9. The method according to claim 8, wherein the second insulating layer includes SiOx and the third insulating layer includes SiNx.

10. The method according to claim 1, wherein the forming a thin film transistor structure step comprises the sub-steps of:

forming an amorphous silicon layer on the second insulating layer over the first gate electrode;

forming an impurity amorphous silicon layer on the amorphous silicon layer;

forming the first and second electrodes on the impurity amorphous silicon layer over the first and second portions of the amorphous silicon layer;

etching the impurity amorphous silicon layer using the first and second electrodes as a mask.

11. The method according to claim 1, wherein the first and second electrodes includes one of Al and AlTa.

12. The method according to claim 1, wherein the step of forming first and second contact holes comprises the sub-step of:

first etching the passivation layer over the first source/drain electrode and the second gate electrode to form the first contact hole and a portion of the second contact hole, respectively; and second etching the second insulating layer, the first insulating layer and the anodizing metallic layer over the non-anodizing metallic layer of the second gate electrode to complete formation of the second contact hole.

13. The method according to claim 12, wherein the non-anodizing metallic layer has an etching selection ratio which differs from an etching selection ratio of the anodizing metallic layer.

14. The method according to claim 12, wherein the first and second etching steps are performed by plasma etching.

15. The method according to claim 1, wherein the substrate is a glass substrate, the first region is a thin film transistor region, and the second region is a pad region.

16. The method according to claim 1, wherein the first and second gate electrodes include two anodizing metallic layers.

17. The method according to claim 1, wherein the first insulating layer is not formed on the substrate.

18. A method of fabricating a liquid crystal display device, comprising:

forming a first and second gate electrode on a first and second region, respectively, of a substrate, the first and second gate electrodes each including at least a first and second metallic layer, the first metallic layer having an etching selection ratio which differs from an etching selection ratio of the second metallic layer;

forming a first insulating layer on the second metallic layer of the first and second gate electrodes;

forming at least a second insulating layer over the substrate;

forming a thin film transistor structure which utilizes the first gate electrode as a gate, the thin film transistor structure including a semiconductor layer on the second insulating layer over the first gate electrode, an impurity semiconductor layer on first and second portions of the semiconductor layer, and first and second source/drain electrodes on the impurity semiconductor layer covering the first and second portions of the semiconductor layer, respectively;

depositing a passivation layer over the substrate;

forming first and second contact holes, the first contact hole exposing the first source/drain electrode, and the second contact hole exposing the second gate electrode; and forming a pixel electrode on the passivation layer and in contact with the first source/drain electrode and the second gate electrode.

19. The method according to claim 18, wherein the first metallic layer includes one of Cr, Mo, and Ti.

20. The method according to claim 18, wherein the second metallic layer includes one of Al and AlTa.

21. The method according to claim 18, wherein the forming a first insulating layer step comprises the sub-step of:

anodizing the second metallic layer of the first and second gate electrodes.

22. The method according to claim 18, wherein the step of forming first and second contact holes comprises the sub-step of:

etching the passivation layer over the first source/drain electrode and the second gate electrode to form the first contact hole and a portion of the second contact hole, respectively; and etching the second insulating layer, the first insulating layer and the second metallic layer over the first metallic layer of the second gate electrode to complete formation of the second contact hole.

23. A liquid crystal display device, comprising:

a substrate;

a first and second gate electrode formed on a first and second region, respectively, of the substrate, the first and second gate electrodes each including a non-anodizing metallic layer and at least one anodizing metallic layer;

a first insulating layer formed on the anodizing metallic layer of the first and second gate electrodes;

at least a second insulating layer formed over the substrate;

a semiconductor layer formed on the second insulating layer over the first gate electrode;

an impurity semiconductor layer formed on first and second portions of the semiconductor layer;

first and second source/drain electrodes formed on the impurity semiconductor layer covering the first and second portions of the semiconductor layer, respectively;

a passivation layer formed over the substrate, the passivation layer defining a first contact hole exposing the first source/drain electrode, the passivation layer and the first and second insulating layer defining a second contact hole exposing the second gate electrode; and a pixel electrode formed on the passivation layer and in contact with the first source/drain electrode and the second gate electrode via the first and second contact holes, respectively.

24. The liquid crystal display of claim 23, wherein the anodizing metallic layer of the second gate electrode defines a portion of the second contact hole, and the second contact hole exposes the non-anodizing metallic layer of the second gate electrode.

25. The liquid crystal display of claim 23, wherein the first insulating layer is formed on the anodizing metallic layer and sidewalls thereof.

26. The liquid crystal display of claim 23, wherein the non-anodizing metallic layer includes one of Cr, Mo, and Ti.

27. The liquid crystal display of claim 23, wherein the anodizing metallic layer includes one of Al and AlTa.

28. The liquid crystal display of claim 23, further comprising:

a third insulating layer formed over the substrate; and wherein the second insulating layer is formed on the third insulating layer.

29. The liquid crystal display device of claim 28, wherein the third insulating layer includes SiOx and the second insulating layer includes SiNx.

30. The liquid crystal display device of claim 23, wherein the first and second source/drain electrodes include one of Al and AlTa.

31. The liquid crystal display device of claim 23, wherein the first and second gate electrodes include two anodizing metallic layers.

32. A liquid crystal display device, comprising:

a substrate;

a first and second gate electrode formed on a first and second region, respectively, of the substrate, the first and second gate electrodes each including at least a first and second metallic layer, the first metallic layer having a different etching selection ratio than an etching selection ratio of the second metallic layer;

a first insulating layer formed on the second metallic layer of the first and second gate electrodes;

at least a second insulating layer formed over the substrate;

a semiconductor layer formed on the second insulating layer over the first gate electrode;

an impurity semiconductor layer formed on first and second portions of the semiconductor layer;

first and second source/drain electrodes formed on the impurity semiconductor layer covering the first and second portions of the semiconductor layer, respectively;

a passivation layer formed over the substrate, the passivation layer defining a first contact hole exposing the first source/drain electrode, the passivation layer and the first and second insulating layer defining a second contact hole exposing the second gate electrode; and a pixel electrode formed on the passivation layer and in contact with the first source/drain electrode and the second gate electrode via the first and second contact holes, respectively.

* * * * *